(12) United States Patent
Holzapfel et al.

(10) Patent No.: US 8,649,513 B2
(45) Date of Patent: Feb. 11, 2014

(54) METHOD FOR CONVERTING NON COPY PROTECTED DATA INTO COPY PROTECTED DATA

(75) Inventors: Klaus Holzapfel, Kuchl (AT); Walter Hinterhoelzl, Grodig (AT); Thomas Goebl, Bad Vigaun (AT); Markus Prenn, Salzburg (AT); Rupert Schoenauer, Golling (AT)

(73) Assignee: SONY DADC Austria AG, Anif (AT)

( * ) Notice: Subject to any disclaimer, the term of this patent is extended or adjusted under 35 U.S.C. 154(b) by 1571 days.

(21) Appl. No.: 11/438,312

(22) Filed: May 23, 2006

(65) Prior Publication Data
US 2006/0291651 A1 Dec. 28, 2006

(30) Foreign Application Priority Data
Jun. 13, 2005 (EP) ..................................... 05012681

(51) Int. Cl.
*G06F 11/30* (2006.01)

(52) U.S. Cl.
USPC ............................. 380/201; 713/189; 713/194

(58) Field of Classification Search
USPC ................. 380/201; 713/189–193; 726/22–26
See application file for complete search history.

(56) References Cited

U.S. PATENT DOCUMENTS

| 6,005,568 | A * | 12/1999 | Simonoff et al. ............. 715/744 |
| 6,341,196 | B1 * | 1/2002 | Ando et al. ....................... 386/95 |
| 6,898,799 | B1 * | 5/2005 | Jarman ............................ 725/25 |
| 2001/0009002 | A1 * | 7/2001 | Logan et al. .................... 705/34 |
| 2002/0069389 | A1 | 6/2002 | Sollish et al. |
| 2002/0159591 | A1 | 10/2002 | Heylen et al. |
| 2003/0086566 | A1 * | 5/2003 | Gooch ........................... 380/200 |
| 2004/0003270 | A1 * | 1/2004 | Bourne et al. ................. 713/193 |
| 2004/0156621 | A1 * | 8/2004 | Seo et al. ......................... 386/95 |
| 2004/0161108 | A1 * | 8/2004 | Ando et al. .................... 380/201 |

(Continued)

FOREIGN PATENT DOCUMENTS

| EP | 1 528 557 A1 | 5/2005 |
| JP | 8-212681 A | 8/1996 |

(Continued)

OTHER PUBLICATIONS

English Translation of Office Action issued Feb. 1, 2011, in Japanese Patent Application No. 2006-163931.
U.S. Appl. No. 13/371,952, filed Feb. 13, 2012, Holzapfel, et al.

*Primary Examiner* — Kambiz Zand
*Assistant Examiner* — Phy Anh Vu
(74) *Attorney, Agent, or Firm* — Oblon, Spivak, McClelland, Maier & Neustadt, L.L.P.

(57) ABSTRACT

Method for converting non copy protected data into copy protected data. The non copy protected data includes data structure data, controlling data and content data. The content data are embedded into data structures defined by the data structure data, and are processed using the controlling data. The method includes transferring part of the data structure data or the controlling data via a first network, from a first to a second network location, generating modified data structure data or modified controlling data at the second network location based on the data structure/controlling data supplied to the second network location, transferring the modified data structure/controlling data via a second network from the second to a third network location, where the copy protected data is generated by embedding the content data into modified data structures based on the modified data structure data or by replacing the controlling data with the modified controlling data.

19 Claims, 6 Drawing Sheets

(56) References Cited

U.S. PATENT DOCUMENTS

| | | | |
|---|---|---|---|
| 2004/0187161 A1* | 9/2004 | Cao | 725/110 |
| 2005/0010805 A1* | 1/2005 | Jascau et al. | 713/200 |
| 2005/0180567 A1* | 8/2005 | Williams | 380/201 |
| 2006/0117351 A1* | 6/2006 | Sanders et al. | 725/50 |
| 2007/0274180 A1* | 11/2007 | Kato et al. | 369/47.16 |

FOREIGN PATENT DOCUMENTS

| | | |
|---|---|---|
| JP | 2001-332025 | 11/2001 |
| JP | 2002-63147 A | 2/2002 |
| JP | 2003-199031 | 7/2003 |
| JP | 2003-323768 | 11/2003 |

* cited by examiner

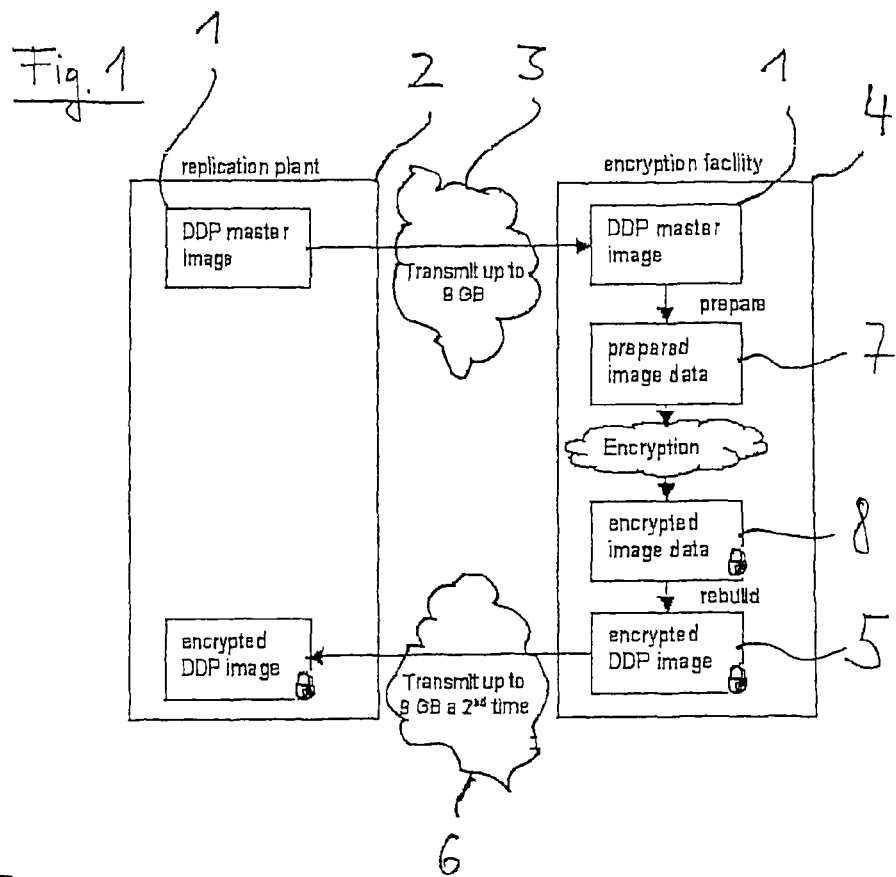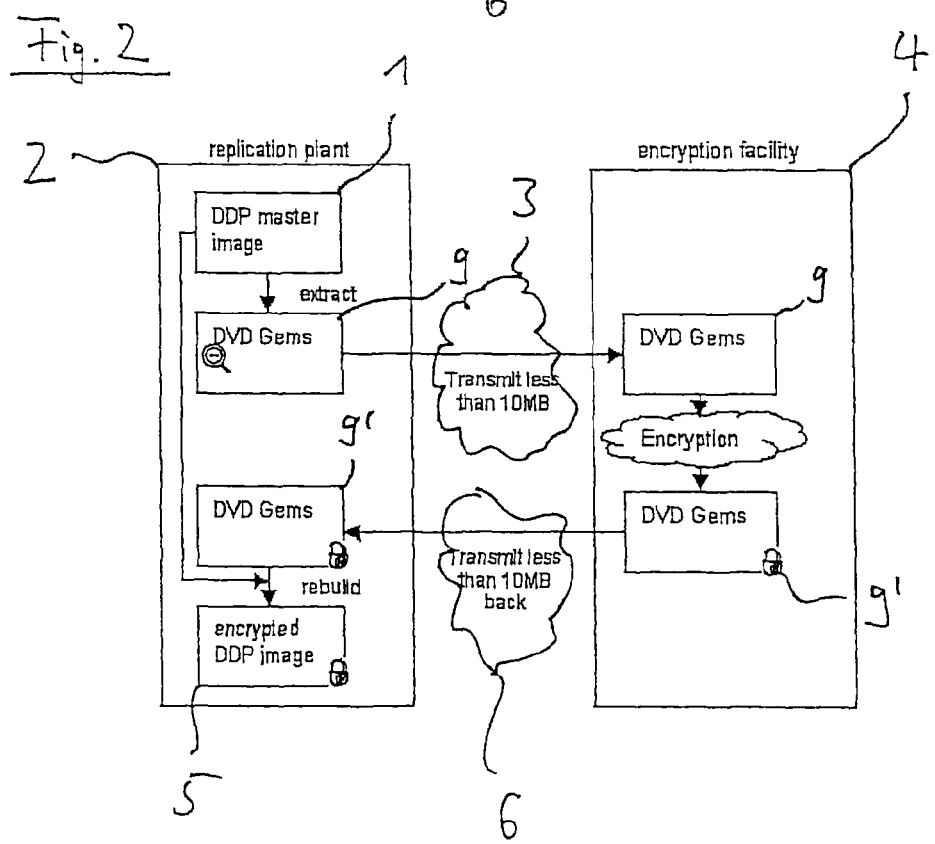

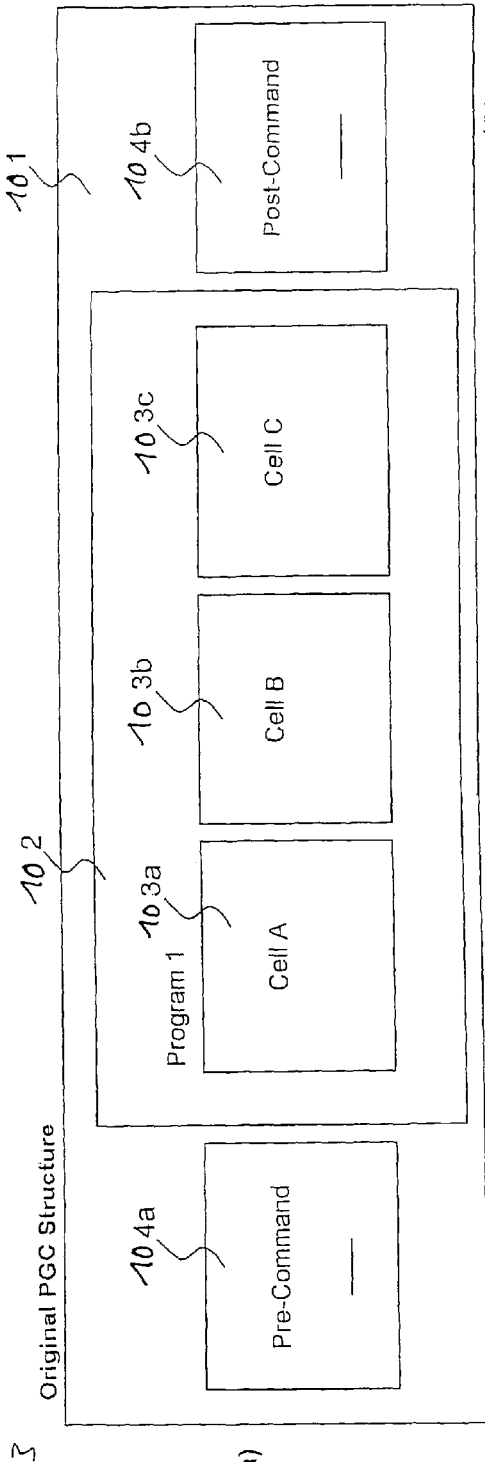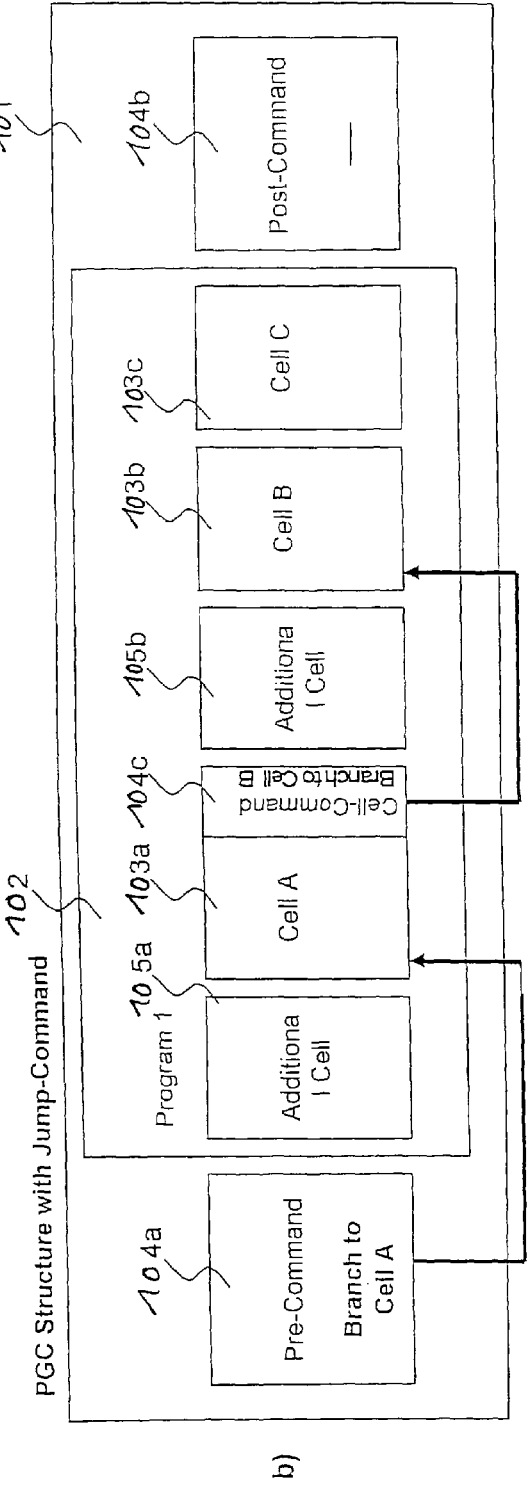
Fig. 3

Figure 5:
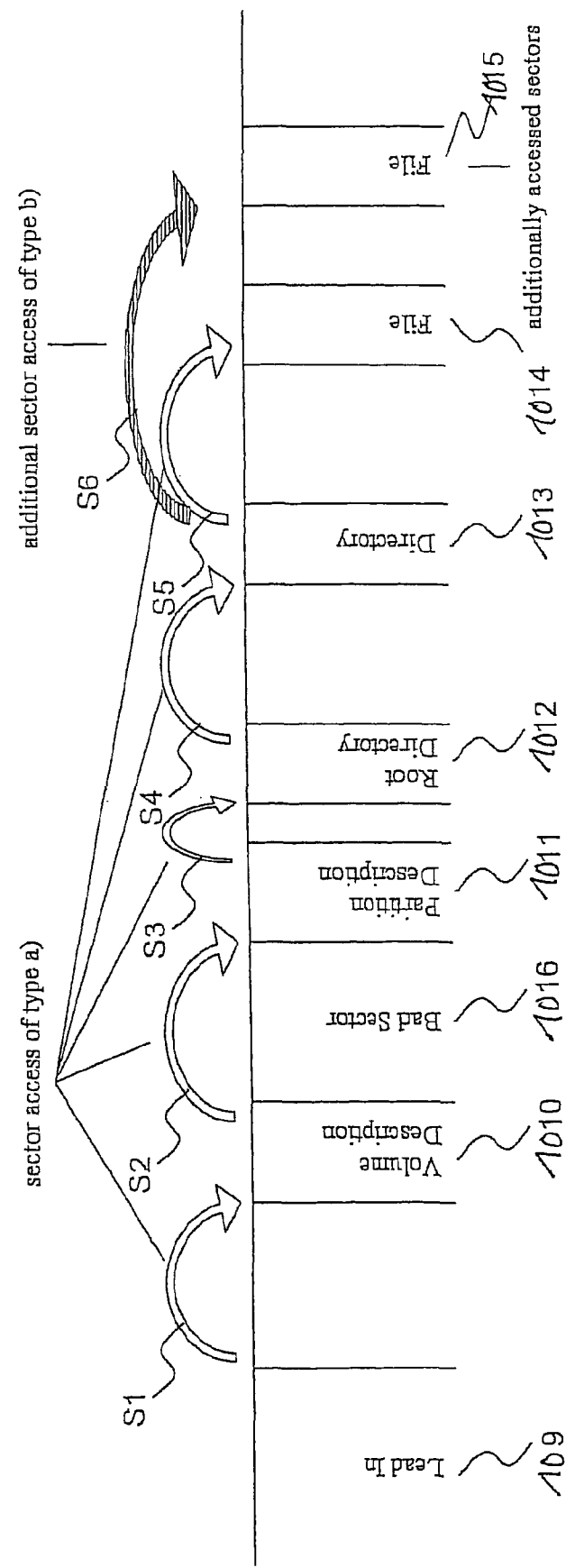

Fig. 5  File system sector access

ECC block configuration

Data sector configuration

METHOD FOR CONVERTING NON COPY PROTECTED DATA INTO COPY PROTECTED DATA

The invention relates to a method for converting non-copy protected data into copy protected data.

Copy protection mechanisms are very effective means for preventing unauthorized copying of data like audio data or video data. Normally, the process of converting non copy protected data into copy protected data requires a lot of technical knowledge. Therefore, it is common to concentrate the knowledge needed for the conversion process at a single conversion location. This situation is shown in FIG. 1:

Non copy protected data 1 is generated at a first network location 2 which may for example be a film production company, a graphic arts studio, etc. Here, the non copy protected data is DVD data including DVD data structure data, DVD controlling data and DVD content data. The DVD content data is embedded into data structures ("data layout") which is implied/defined by the DVD data structure data, and which is processable using the controlling data. In this example, the non copy protected data 1 shows an industry standard format called "DDP" (Disk Description Protocol).

In order to convert the non copy protected data 1 into copy protected data, the data is transferred from the first network location 2 to a second network location 4 via a communication network 3 (for example the internet). Then, the non copy protected data 1 is converted into copy protected data 5. Finally, the copy protected data 5 is transferred via a second communication network 6 (for example the internet) from the second network location 4 back to the first network location 2. The copy protected data 5 is replicated at the first network location 2 (for example, several DVDs are produced in a factory located at the first network location 2, each of the DVDs comprising the copy protected data 5).

The conversion process which converts the non copy protected data 1 into the copy protected data 5 comprises several steps: First, the non copy protected data 1 is transformed into non copy protected data 7 being more suitable for conversion than the non copy protected data 1 (in principle it would also be possible to apply the conversion process directly to the non copy protected data 1, however this would require a more complex conversion process), which may for example include data extraction, data splitting and data processing. Second, the non copy protected data 7 is subjected to a conversion process in order to obtain copy protected data 8. Last, the copy protected data 8 is transformed into the copy protected data 5. In this step, data embedding processes, data unifying processes, and data processing may be performed in order to "reconstruct" the DDP image (the copy protected data 8 which does not show the DDP format is converted into the copy protected data 5 showing the DDP format). The copy protected data 5 shows the same data format as the non copy protected data 1 (here: DDP format).

A disadvantage of the above-described method is that the amount of data which has to be transferred between the first network location 2 and the second network location 4 is very high. In case that the data to be transferred is DVD data, up to 9 gigabytes of data has to be transferred from the first network location 2 to the second network location 4 and back from the second network location 4 to the first network location 2. As a consequence, the conversion method described above is very time-consuming.

It is an object of the present invention to provide a method for converting non copy protected data into copy protected data which is less time-consuming.

In order to solve this object, the present invention provides a method for converting non copy protected data into copy protected data according to claim 1. Further, the present invention provides a data signal according to claim 15. Last, a master disk according to claim 18 is provided. Further features and preferred embodiments of the present invention are defined in the subclaims.

According to the present invention, a method for converting non copy protected data into copy protected data is provided, wherein the non copy protected data comprises data structure data, controlling data and content data, the content data being embedded into the data structures defined by the data structure data, and being the processible using the controlling data. The method comprises the following steps:

transferring at least parts of the data structure data and/or the controlling data via a first communication network from a first network location to a second network location, generating modified data structure data and/or modified controlling data at the second network location in dependence of the data structure data/controlling data supplied to the second network location, transferring the modified data structure data and/or modified controlling data via a second communication network from the second network location to a third network location, and generating, at the third network location, the copy protected data by embedding the content data into a modified data structure being defined by the modified data structure data and/or by replacing the controlling data by the modified controlling data.

According to the present invention, the process of converting non copy protected data into copy protected data is not performed at a single network location like in conventional conversion processes. Rather, the conversion process is performed at two different network locations: the second network location and the third network location. At the second network location, the copy protected "layout" (which includes the modified data structures and the modified navigation data) is generated. At the third network location, this layout is "filled" with the content data of the non copy protected data. Thus, only those parts of the non copy protected data concerning layout issues have to be transferred from the first network location to the second network location and from the second network location to the third network location. Since, however, the data size of the data structure data and the controlling data is small compared to the data size of the content data, the conversion method according to the present invention needs significantly less time than known conversion methods.

Preferably, the term "first network location" represents a location where the non copy protected data is generated or available, for example, a film factory, film studio or mastering facility. The term "second network location" represents a location where the copy protected layout of the copy protected data is generated. The term "third network location" represents the location where the copy protected data is needed, for example a replication plant which produces data carriers storing the copy protected data. The first network location may be identical with the third network location if for example the location where the non copy protected data is generated or is available is the same location as the location where the copy protected data is needed later (data generating location and data replication location are identical). However, if those locations refer to different countries, the first network location and the third network location differ from each other.

The term "communication network" may for example be the internet. However, any other communication network may also be used like a wireless network or an intranet or a combination of different types of networks, secure networks or secure connetions including virtual private networks may be used.

The present invention is strongly correlated with a specific copy protection system ("ArccOS" copy protection system) which will be described in the following. The "ARccOS" copy protection system is in particular applicable in the context of DVD data, but can generally applied to each kind of content data.

In the ARccOS copy protection system, the content data advantageously forms a content data stream, and the controlling data enables to selectively access and/or process specific parts of the content data stream. The content data stream may be divided into several parallel content data substreams. In this case, the controlling data enables to selectively access and/or process specific parts of each content data substream.

The content data may for example form a first stream of content cells which are at least partially linked with each other by the controlling data. In the same manner, the copy protected (content) data may form a second stream of content cells which are at least partially linked with each other by the modified controlling data. In this case, the second stream of content cells may be obtained by inserting reproduction obstructing cells into the first stream of content cells during the step of generating the copy protected data (at the third network location). The obstructing cells contain content which "confuses" copy devices when trying to read out the data being included within the obstructing cells.

According to an embodiment of the present invention, it is determined during the step of generating modified data structure data at the second network location at which stream positions the reproduction obstructing cells will be inserted into the first stream of content cells later during the step of generating copy protected data. In other words: The modified data structure data may include all (or at least a part of) information specifying at which stream positions the reproduction obstructing cells will be inserted into the first stream of content cells (at the third network location). In the same way, it may be determined during the step of generating modified controlling data how the reproduction obstructing cells will be linked to the content cells of the second data stream during the step of generating the copy protected data. In other words: The modified controlling data may include all (or at least a part of) information specifying how the reproduction obstructing cells will be linked to the content cells of the second data stream (at the third network location). The insertion of the obstructing cells into the data stream can then be carried out straightforward at the third network location in dependance on the modified data structure data and modified controlling data (for example by a JAVA applet).

When applying the ARccOS copy protection mechanism to data stored on a data carrier like a DVD, the complete layout of the data carrier is changed. Therefore, respective storage positions of old (non copy protected) stream data (stream of content cells) on the data carrier are in most cases not the same as respective storage positions of new (copy protected) stream data. In the rebuild step (the generating step at the third network location) the original stream data is copied from old storage positions on the unprotected data carrier to respective new storage positions on the protected data carrier. In order to perform this process, it is necessary to know the old and new storage positions of the stream data. Therefore, in an embodiment of the present invention, the original storage positions are stored in "DVD Gems" (i.e. are transmitted as parts of controlling data from the first network location to the second network location and later from the second network location to the third network location). The new stream data storage positions can be derived from the modified data structure data. The old stream data storage positions are derived from the references stored in the DVD Gems (which may for example be part of the modified controlling data).

The present invention is applicable to all types of data. The data structure data, the controlling data and the content data may for example relate to digital audio and/or video content stored on a data carrier, for example DVD (Digital Versatile Disk) data, CD (Compact Disc) data, BlueRayDisk data, HD DVD (High Density Digital Versatile Disk) data, etc. Preferably, however, the present invention is usable in the context of DVD data. In this case, the term "data structure data" in particular means data that describes the physical layout of the DVD disk like the number of data sectors or information concerning disk layer aspects (single layer disk, double layer disk), the layout of information areas (file system data), and copy protection information. In the context of DVD data, the term "controlling data" in particular means DVD navigation data (video manager information, title set information, program chain information, presentation control information, data search information and navigation commands).

An advantage of the present invention is that the whole knowledge needed to perform the converting process can be concentrated at the second network location since the generation of the modified data structure data and the modified controlling data is the most difficult part within the conversion process. The process of embedding the content data into the modified data structure which is defined by the modified data structure data as well as the replacement of the (old) controlling data by the (new) modified controlling data is straightforward and generally automated. Therefore, in some embodiments, the step of embedding the content data into the modified data structure and the step of replacing the controlling data by the modified controlling data are "automatically" performed by an assembling software (preferably a java applet) at the third network location. The assembling software is responsible for assembling (combining) the old content data, the new data structure data and the new controlling data together in order to obtain the copy protected data. Since the behaviour of the software has to be adapted to the kind of modified data structure data and modified controlling data, the assembling software is preferably prepared at the second network location together with the modified data structure data and the modified controlling data. The assembling software may be offered for download at the second network location or may be automatically delivered together with the modified data structure data and the modified controlling data to the third network location. Advantage of generating the assembling software at the second network location is that, if the way of generating modified data structure data and modified controlling data changes, also the corresponding assembling software can be automatically adapted thereto, which makes it possible to change the type of modified data structure data and modified controlling data frequently, without confusing the staff running the assembling software.

In order to improve security during data transmission, all data being exchanged between the network locations may be encrypted (for example with a PGP encryption mechanism) before the data is exchanged.

The present invention further provides a data signal representing modified data structure data and modified controlling data, the modified data structure data being suitable to define modified data structures on a data carrier, wherein the modified data structures serve for embedding content data and the modified controlling data, the content data being accessable and/or processable using the modified controlling data.

The data signal may be generated in dependance on non copy protected data comprising data structure data, controlling data and content data, the content data and controlling data being embedded into data structures defined by the data structure data, the content data being accessable and/or processable using the controlling data, and wherein the generation process of the data signal comprises the following steps:
- transferring at least parts of the data structure data and the controlling data via a first communication network from a first network location to a second network location,
- generating the modified data structure data and the modified controlling data at the second network location in dependence on the data structure data/controlling data supplied to the second network location, thereby obtaining the data signal.

The data signal may serve for converting the non copy protected data into copy protected data, the conversion process being performed by:
- transferring the data signal from the second network location to a third network location,
- generating, at the third network location, the copy protected data by embedding the content data and the modified controlling data into the modified data structures being defined by the modified data structure data.

Finally, the present invention provides a master disk for storing a copy protected master image, the master disk being suitable to transfer the copy protected master image onto a plurality of data carriers. The master image consists of modified data structure data, content data and modified controlling data, the content data and modified controlling data being embedded into modified data structures defined by the modified data structure data, and the content data being accessable and/or processable using the modified controlling data. The copy protected master image is generated as follows:
- transferring at least parts of data structure data and controlling data of non copy protected data from a first network location to a second network location, the non copy protected data comprisisng the data structure data, the controlling data and content data, the content data and controlling data being embedded into data structures defined by the data structure data, the content data being accessable and/or processable using the controlling data,
- generating the modified data structure data and the modified controlling data at the second network location in dependence on the data structure data/controlling data supplied to the second network location,
- transferring the modified data structure data and modified controlling data via a second communication network from the second network location to a third network location,
- generating, at the third network location, the copy protected master image by embedding the content data and the modified controlling data into the modified data structures being defined by the modified data structure data.

In the following description, further features, embodiments and advantages of the present invention will be explained while making reference to the accompanying drawings, wherein:

FIG. 1 shows a schematic drawing illustrating a conventional method for converting non copy protected data into copy protected data.

FIG. 2 a schematic drawing illustrating a prefered embodiment of the inventive method for converting non copy protected data into copy protected data.

Figure 4:
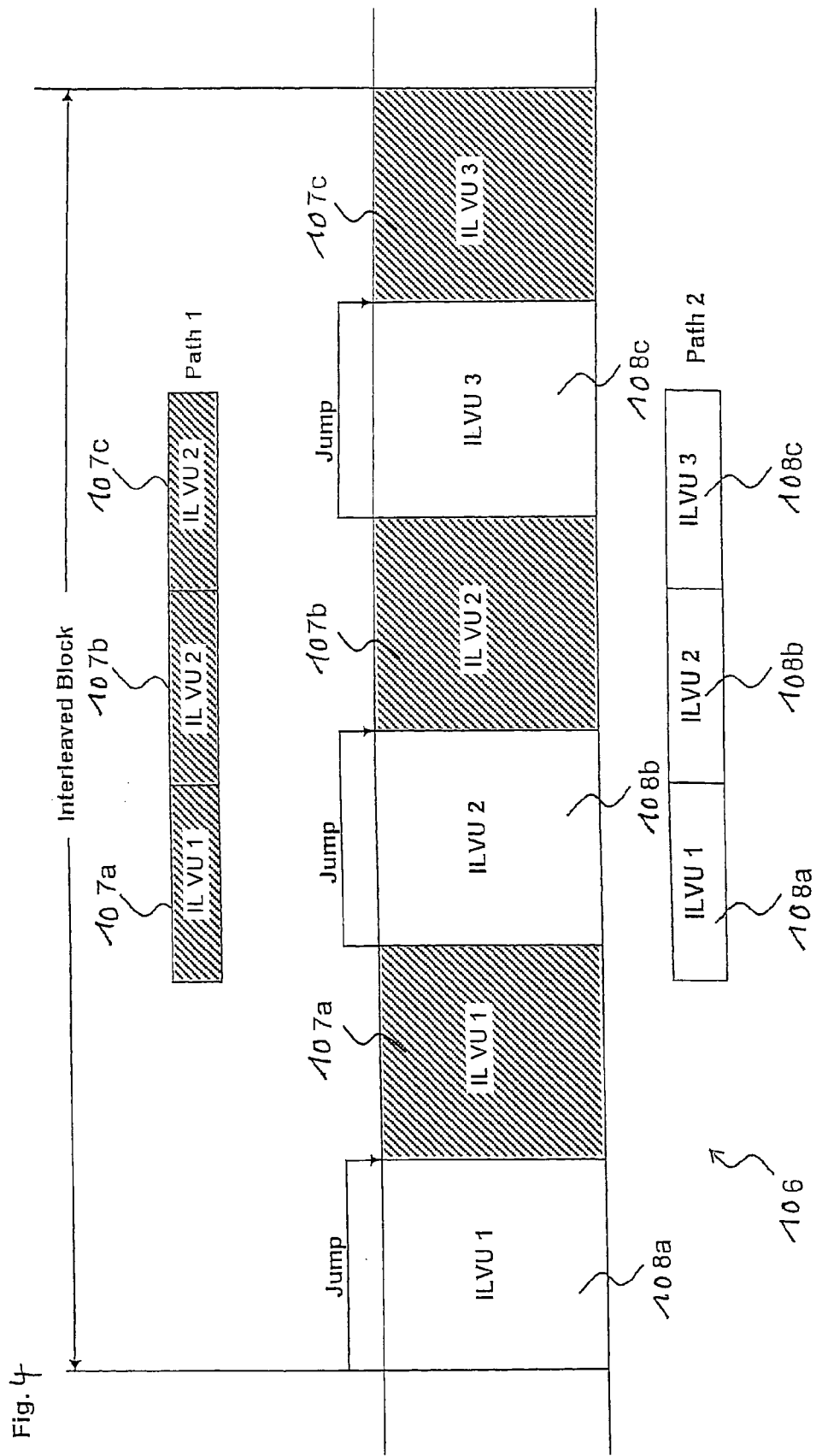
Figure 6:
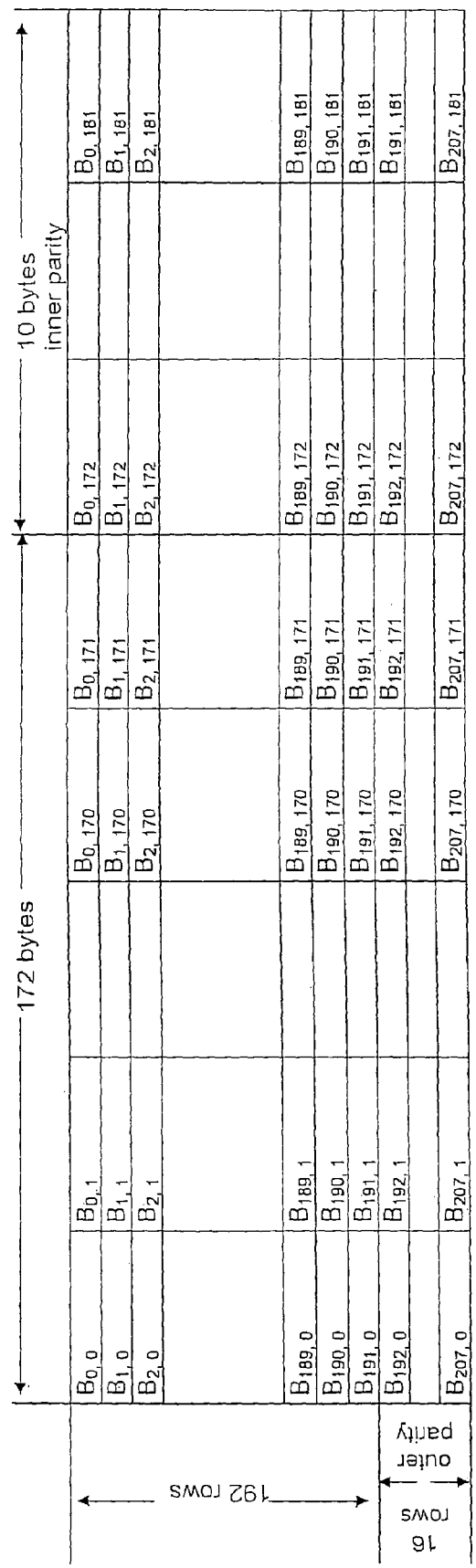
Figure 7:
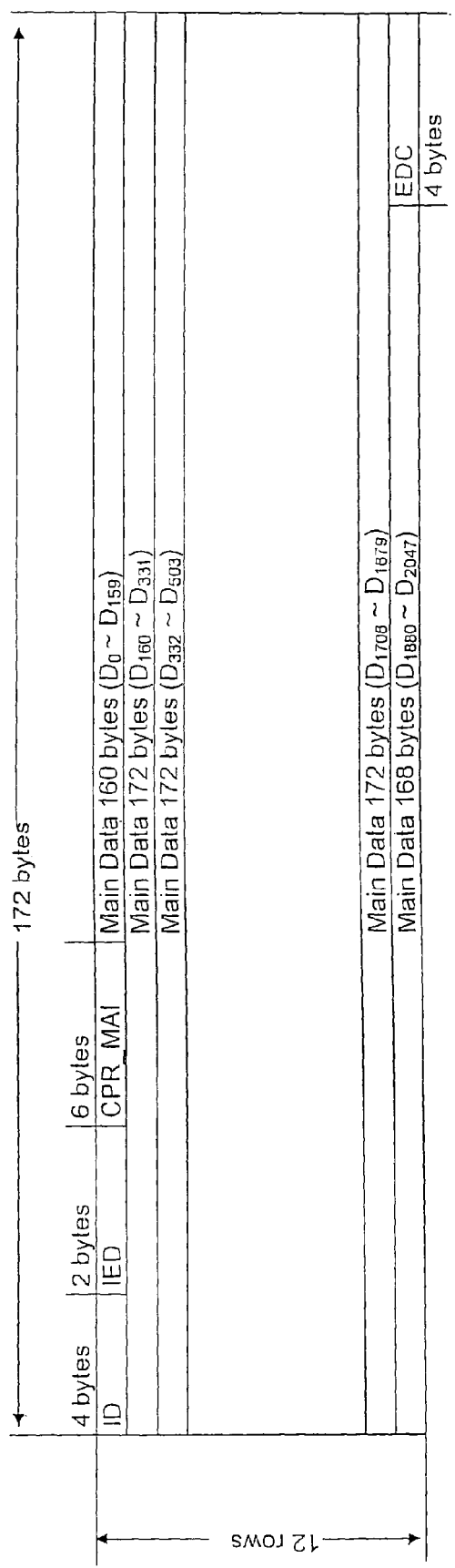

FIG. 3 shows a possible application of a branch command to create a region that will not be reached during playback with a dedicated playback device, but usually will be reached during a more linear access in the context of the ARccOS copy protection system, FIG. 4 depicts interleaved presentation data and methods of their access in the context of the ArccOS copy protection system, FIG. 5 depicts methods of file system sector access in the context of the ARccOS copy protection system, FIG. 6 shows the ECC block configuration in the context of the ARccOS copy protection system, FIG. 7 shows the data sector configuration in the context of the ARccOS copy protection system.

According to FIG. 2, an extraction process is performed which extracts data parts of non copy protected DVD data 1 ("Gems") 9 and sends those data parts 9 via a communication network 3 from a first network location 2 to a second network location 4. The data parts 9 comprise at least parts of data structure data and/or controlling data of the non copy protected data 1 and are already suitable for being subjected to a conversion process.

At the second network location 4, the data parts 9 are subjected to a conversion process in order to obtain modified data parts 9'. The modified data parts 9' comprise modified data structure data and/or modified controlling data which are generated in dependence of the data structure data/controlling data supplied to the second network location 4. The modified data parts 9' are transferred via a second communication network 6 from the second network location 4 to the first network location 2. Perferably, an assembling software is transferred together with the modified data parts 9' to the the first network location 2 or offered for download at the second network location 4.

At the first network location 2, content data being included with the non copy protected data 1 is embedded into the modified data structure being implied by the modified data structure data using the assembling software. Further, the controlling data being included within the non copy protected data 1 is replaced by the modified controlling data using the assembling software. Thus, finally copy protected data 5 is generated.

The present invention is in particular applicable to a special DVD copy protection mechanism called "ARccOS". This copy protection mechanism is designed to prevent unauthorized copying of DVD Video contents. ARccOS is applied to a final master image which is usually stored in an industry standard format called DDP. Since ARccOS encryption requires a well trained operator staff, in may cases the encryption has to be done in a remote encryption facility. DVD master images usually have a size between 4 and 9 GB and therefore the transmission of this data over a wide area network at time being is very expensive and time consuming.

The idea of the present invention is to overcome this obstacle by reducing the transmitted data to an acceptable volume. This is done by a extraction of the essential data required for the encrpytion process.

This essential data are called "DVD Gems". A critical step in this process is the rebuild of the final encrypted DDP image. In this step the protected DVD Gems must be complemented with the data of the input image to create a correct encrypted DDP image again. The use of DVD Gems reduces workflow costs and improves turnaround time significantly.

In the following description, a more detained description of the ARccOS copy protection mechanism will be given.

The ARccOS copy protection system relates to a method that prevents the copying of content stored on record carriers or storage media and/or makes copying more difficult. Further, the ARccOS copy protection system relates to corresponding record carriers protected with this method. In particular, the ARccOS copy protection system relates to optical media conforming to the DVD video specification, but is not limited thereto.

To protect the rights of the owners of the copy rights many specifications for storage media includes copy protection mechanisms. For DVD video discs generally three mechanisms are used:

Analog CPS: This method is designed to decrease the quality of DVD video content when copied to an analog video tape medium.

CGMS: The serial copy management system (CGMS) is designed to prevent initial copies or generational copies (copies of copies). This method embeds copy control information in the storage media and in the outgoing video signal. The recording device is responsible to respect this information and refuse copying when required.

CSS: The content scrambling system (CSS) is a data encryption and authentication scheme. The content stored on DVD video media is encrypted and the decryption key is in the lead-in region of the disc. DVD-ROM drives have to allow access to this data only after a successful authentication procedure.

Since the use of analog video tapes is regressive the Analog CPS system is losing its importance. The most important threat for the copy rights of DVD video content is the widespread availability of personal computer systems.

In October, 1999 a group of crackers reverse-engineered the CSS system and software to decrypt CSS protected content was distributed over the internet. Based on this software a large number of software applications were built to copy DVD video content on computer hard disc drives, and/or copy DVD video content to recordable media.

The use of these software applications is very simple and creates an identical or high quality copy of the original content. Since no special skill is required this software applications are very popular and are widely used. The wide use of this software causes a significant reduction of sold DVD video media and consequently an enormous financial harm to the owner of the copy rights.

In many cases a copy of the whole data on the media (one-to-one copy) is not possible since the target media does not have the same data capacity. For example most DVD video discs are so called DVD9 discs with a data capacity of about 9 GB. Available recordable DVD media (DVD-R, DVD-RW, DVD+R, DVD+RW, DVD-RAM) do have a maximum data capacity of about 4.5 GB. The data capacity of CD recordable media is far less. Therefore, the DVD video copy software has to reduce the amount of data. This can be done by extracting parts of the content, and/or a higher compression of the content.

DVD video copy software usually supports both ways to reduce the data.

Therefore, the ARccOS copy protection system was developed in order to provide a record carrier that shows improved copy protection characteristics and an improved method to provide a copy protection for a record carrier, in particular for a record carrier according to the DVD format or a comparable format.

A comparable format according to the ARccOS copy protection system is in particular a format according to which at least one stream of linked content cells is stored on the record carrier.

Therefore, a record carrier for storing at least one stream of linked content cells thereon, which linking is performed based on navigation data, according to the ARccOS copy protection system comprises modified navigation data and/or a stream arrangement of at least one stream of linked content cells, so that an access of the record carrier under consideration of the navigation data is not disturbed, whereas a generally linear access of the record carrier is disturbed.

Correspondingly, the method to provide a copy protection for a record carrier for storing at least one stream of linked content cells thereon, which linking is performed based on navigation data, according to the ARccOS copy protection system comprises the step(s) of modifying navigation data and/or setting a stream arrangement of at least one stream of linked content cells, so that an access of the record carrier under consideration of the navigation data is not disturbed, whereas a generally linear access of the record carrier is disturbed.

Further correspondingly, the method to copy a record carrier for storing at least one stream of linked content cells thereon, which linking is performed based on navigation data, according to the ARccOS copy protection system comprises the step of accessing of the record carrier under consideration of the navigation data.

An access of the record carrier according to the ARccOS copy protection system is in particular an access of the at least one stream of linked content cells on the record carrier, but is not limited to this possibility, but may e. g. also be an access of file system structures and/or file content used to locate the linked content cells, as will be set-out below.

There is a significant difference in the way a common playback device (or playback software) uses the properties of linked content cells, e. g. the DVD video data, and usual copy software for such linked content cells, e. g. DVD video copy software, uses these properties. These properties are here summarized under the term "navigation data" (which is "controlling data" in the sense of the present invention) which means not only data used to navigate between different streams, but also data that is used to set-up a respective stream, to define its beginning and end, to branch a stream, to unify two streams, etc.

1) A playback device (or playback software) that is dedicated to the particular type of record carrier renders the presentation data according to the current player status and user actions (e. g. remote control commands). Due to the usual interactive capabilities of such record carriers that store at least one stream of linked content cells thereon, e. g. DVD video media with multiple languages, the data access is more non-linear.

2) Copy software is designed to copy the requested content. It usually has a simplified player status model and can ignore parts of the navigation data. The data access is more linear. It can be a desired behaviour of this software to copy without interpreting the navigation data, in particular, the copy software aims for a 1:1 copy of the navigation data so that the copied disc includes the whole navigation functionality. Therefore, the navigation data is read and written, but not interpreted.

The ARccOS copy protection system as defined above exploits this different usage. Accordingly, a method to copy a record carrier according to the ARccOS copy protection system performs an access of the original record carrier comparable to a "normal reading", i. e. a reading during normal access of the record carrier, so that a properly working copy of the original record carrier is obtained, in other words, the navigation data is considered/interpreted as set-out under 1) above.

According to the ARccOS copy protection system, preferably the following measures are taken to exploit this different usage so that navigation data is set in a way that copy protection or reproduction obstruction of copies is achieved for streaming media, as e. g. defined in the MPEG standard ISO/IEC 13818-1, where the presentation stream is divided into regions called "cells" and the navigation data is used to access the presentation stream and to allow user interaction in connection with the presentation stream.

A record carrier according to the ARccOS copy protection system in an embodiment comprises:

at least one reproduction obstructing cell physically stored before or after a linked content cell, and/or a physical storage arrangement of at least one of the at least one stream of linked content cells that is not in conformity with the linking order of these content cells, and/or file system structures and/or file content used to locate the linked content cells on the record carrier that direct read-out devices that use data that are not explicitly stated in the standard of the record carrier to at least one reproduction obstruction data and/or cyclic data.

Such a reproduction obstruction cell might be physically stored directly before or after the linked content cell or also with a gap to the linked content cell as long as it is likely that a readout-device that performs a more linear access will access the reproduction obstruction cell.

Further, such file system structures and/or file content might be described in extensions or related standards to the standard used to produce the record carrier and needs not to direct the read-out devices to a reproduction obstruction cell, but might also alternatively direct the read-out devices to other reproduction obstruction mechanisms, arranged in arbitrary sectors or parts of the record carrier. An example is that a computer operating system might be designed to provide an access capability for many different file systems, whereas e. g. the DVD Specification for Read-Only Disc is like a second limiting modification of the UDF file system (version 1.02), i. e. comprises only a subset of file access possibilities. The ARccOS copy protection system limits the proper access to devices that behave closely to the standard of the record carrier, in particular the DVD specification for Read-only Disc, but also similar existing or future standards, and devices that are accessing the record carrier according to other standards are rejected.

Correspondingly, a method according to the ARccOS copy protection system in an embodiment comprises the step(s) of:

physically storing at least one reproduction obstructing cell before or after a linked content cell, and/or arranging a physical storage of at least one of the at least one stream of linked content cells that is not in conformity with the linking order of these content cells, and/or modifying file system structures and/or file content used to locate the linked content cells on the record carrier so as to direct read-out devices that use data that are not explicitly stated in the standard of the record carrier to at least one reproduction obstruction data and/or cyclic data.

Correspondingly, a method to copy a record carrier according to the ARccOS copy protection system may comprise the step(s) of:

Determining all reproduction obstructing cells physically stored before or after a linked content cell and modifying or removing these cells so that reproduction of the copy of the record carrier is not obstructed thereby, and/or determining of a linking order of the at least one stream of linked content cells and physically store the at least one stream of linked content cells so that a reproduction of the copy of the record carrier is not obstructed thereby, and/or locate a root navigation file only using file system structures and/or file content related to the linked content cells as described in the standard of the record carrier.

In particular, as indicated above, devices that can properly access a record carrier according to the ARccOS copy protection system locate a root navigation file using file system structures and/or file content related to the linked content cells as described in the used specification, in particular the DVD video specification. All other devices that are rejected, i. e. cannot properly access a record carrier according to the ARccOS copy protection system are not reading navigation and presentation data based on a root navigation file, but on further file system structures and/or file content, which might also be related to the linked content cells, but which is additionally available on the record carrier.

According to the ARccOS copy protection system, said linked content cells may be linked and said at least one reproduction obstructing cell may be physically arranged so that a reproduction device dedicated to said type of record carrier automatically gets navigated around said at least one reproduction obstructing cell during its access of the linked content cells stored on the record carrier, whereas the at least one reproduction obstructing cell gets accessed additionally to the accessed linked content cells when no such dedicated reproduction device is used for accessing the record carrier.

In this sense a reproduction device dedicated to said type of record carrier means a reproduction device that is designed for that type of record carrier, i. e. more or less fully allows to implement all the features enabled by the specific type of record carrier, such as a DVD player for a DVD as a record carrier. A not dedicated reproduction device that is used for accessing the record carrier might be a copy and/or rip device or software that might be designed for such record carriers, but rather for copying the format than for proper access of the specific record carrier.

According to the ARccOS copy protection system, an access of said reproducing obstructing cells may prohibit or disturb a further reproduction or reduce an entertainment value of reproduced content that is originally stored within the content cells on the record carrier.

A reproduction obstruction cell according to the ARccOS copy protection system might be a cell as referred to in the DVD standard, i. e. comparable to a content cell, but might also be another storage unit, e. g. a sector of the record carrier.

According to the ARccOS copy protection system, said reproducing obstructing cells may comprise modifications that do not conform to the DVD Physical Specification, in particular infringe rules of EFM+coding, and/or set wrong ECC data for PI and/or PO, and/or set wrong EDC, ID, CPR_MAI and/or IED data, and or add/set illegal UDF file system data, e. g. cyclic references.

In this context and generally according to the DVD standard, the used abbreviations stand for:

ECC: error correction code. For the purpose of error correction 16 sectors are arranged in a matrix of 192 rows with 172 bytes each. In the first step the inner parity (PI) is calculated for every row of 172 bytes and appended as 10 bytes to the respective row of 172 bytes to complete the line of 182 bytes. In the second step the outer parity (PO) is calculated for every column including the bytes of the inner parity and appended as 16 lines of 182 bytes to the 192 lines of 182 bytes. FIG. 4 depicts the byte arrangement of the 16 sectors. The 10 bytes wide block on the right hand side is the inner parity. The last 16 lines on the bottom is the outer parity.

ID: identification data, which comprises a sector number and sector recording information.

IED: ID error detection code, which is used to find errors in the ID.

CPR_MAI: copyright management information.

EDC: error detection code for the main data, ID, IED and CPR_MAI.

FIG. 5 shows the structure of one DVD sector that comprises 12 rows of 172 bytes, wherein the first row includes 4 bytes ID, 2 bytes IED, 6 bytes CPR_MAI, and 160 bytes main data in that order, the second to eleventh rows include 172 bytes main data, and the twelfth row includes 168 bytes main data and 4 bytes EDC in that order.

According to the ARccOS copy protection system, said reproducing obstructing cells may comprise data that does not conform to the used streaming media standard (e. g. MPEG standard), and/or that generate permutations of reproduced content stored within the content cells, and/or that adds content not related to the content stored within neighbouring content cells, e. g. advertising content, and/or that modifies reproduced audio and/or video content stored within the content cells so that it is experienced unpleasantly.

In this way, it is possible to create the impression that a working copy is produced by a copy/rip device or software, but the copy e. g. only reproduces scrambled content and/or content that additionally comprises advertisements so that the loss of profit made by the copying might be compensated by the additional profit generated through the advertisements.

Therefore, the ARccOS copy protection system generally enables a business model for generating revenues also for copies of record carriers by including at least one advertisement that is generally not shown and also generally not accessible during an access of an original record carrier, since the navigation data, in particular the navigation data, navigates around these advertisements, but that is generally automatically included into at least one copied stream of linked content cells during the copy procedure, e. g. into the video stream and all corresponding audio streams. In this case the user of a copy is regarded to "pay" the license fees for the copied content by being subjected to the at least one advertisement. In particular, this inclusion of the at least one advertisement works independently from the copying software or hardware as long as the above general access schemes are used, i. e. no special copy software or hardware must be installed that includes additional content into the copies record carrier that is not available on the original record carrier.

According to the ARccOS copy protection system, said at least one reproduction obstructing cell may be realized as a stream of linked reproduction obstructing cells that is interleaved with at least one stream of linked content cells, wherein each of the interleaved stream of linked cells provides one playback path and the playback path corresponding to the linked reproduction obstructing cells is not accessed by a reproduction device dedicated to said type of record carrier.

According to the ARccOS copy protection system, said navigation data may comprise branch commands (e. g. link and jump commands) that are arranged in pre-commands and/or post-commands of program chains that comprise at least one program or in cell commands within programs, which are defined as a sequence of content cells.

The following description of an exemplary embodiment of the ARccOS copy protection system. However, the basic idea underlying the ARccOS copy protection system can be applied to similar existing data formats or future data formats.

The relevant specification for DVD video media is the DVD Specifications for Read-Only Disc (despite its name, this specification also applies to DVD recordable media). This specification consists of three parts:

Part 1: Physical Specification
Part 2: File System Specification
Part 3: Video Specification The Physical Specification (Part 1) defines the mechanical and optical parameters of a disc (size, mass, reflectivity, . . . ) and the way data is recorded. Data is recorded in a single spiral track of small pits. The plane area between these pits is called land. The information area is subdivided into sectors, each of which represents a fixed amount of data.

The encoding process starts with sectors of 2048 bytes user data. During the encoding identification data and copyright management data is added to a user data sector. An error detection code (EDC) is calculated and is added to this enlarged sector. After this stage the sector is 2064 bytes large. In the next stage the sector is scrambled. After that an ECC block is formed of 16 subsequent scrambled sectors. An error correction code is calculated for the ECC block. In the last stage of the encoding process the sectors are encoded using the EFM+modulation method.

The File System Specification (Part 2) defines the volume and file structure for DVD media. The format is called "UDF Bridge" and is based on the ISO/IEC 13346 standard. It shall conform to the OSTA Universal Disk Format (UDF) specification and the ISO 9660 standard.

The Video Specification (Part 3) defines the application of Part 1 and 2 for moving picture content. This part can he replaced by corresponding specifications for other applications, e. g. specifications for high definition audio discs.

The DVD specification refers to some other standards. In case of the video encoding the MPEG standard is referred. The MPEG standard defines the data format and the data compression method for the presentation data. Part 3 of the DVD specification additionally defines navigation data. The navigation data enables a lot of additional features, e. g.:

multiple audio tracks (e. g. different languages),
sub-titles,
different camera angles,
multistory seamless branching,
parental lock, and
menus.

As indicated above, many more additional features can be realized using the navigation data, in particular also the copy protection scheme according to the ARccOS copy protection system.

As generally set out above, the ARccOS copy protection system exploits the difference in the data access and usage. In particular the following data access and usage schemes for DVD are identified:

type a) during the playback of DVD video content at common DVD video playback devices, e. g. consumer electronic player or DVD player software, and type b) during ripping, i. e. transferring content on computer hard disc drives, in the following also referred to as copying, or copying content onto a recordable record carrier with rip/copy software.

Type a) is characterized by the use of navigation data in a way it is intended by the DVD video specification, even if this is not true for every detail. Type b) is characterized by ignoring large parts of the navigation data.

According to the described exemplary preferred embodiment of the ARccOS copy protection system the difference between data usage of type a) and type b) is used
- to make rip/copy of DVD video content difficult or impossible, and/or
- to reduce the entertainment value of the copied content.

One way to make the rip/copy of DVD video content difficult or impossible is to modify one or more DVD sectors so that the sectors do not conform to the Physical Specification (Part 1). This can be done by
- intentionally infringe the rules of EFM+ coding, and/or
- intentionally set wrong ECC data (PI, PO), and/or
- intentionally set wrong EDC, ID, CPR_MAI or IED data, and/or
- intentionally add/set illegal UDF file system data, e. g. cyclic references.

Ways to reduce the entertainment value of DVD video content are
- intentionally set data that does not conform to MPEG standard, and/or
- permute parts of the video content, and/or
- add additional video content, e. g. advertising content and/or
- modify audio and/or video content so that it is experienced unpleasantly.

The exemplary preferred embodiment of the ArccOS copy protection system avoids diminutions during playback of type a) by navigation data. Navigation data is used to leave out the modified sectors and the video content with reduced entertainment value.

There are several methods that can be used to leave-out modified regions during playback of type a). These regions, one of which might be enough to copy protect a record carrier, are also referred to as bypassed regions.

One example for this method is the use of navigation commands, which build a part of the navigation data. In particular Branch commands can be used to leave-out parts of the video content.

FIG. 3 shows a possible application of a Branch command to create a region that will not be reached during playback of type a), but usually will be reached during access of type b), i. e. to create a so-called bypassed region.

The DVD Video Specification defines the concept of program chains 101, programs 102 and cells 103. A cell 103 is the smallest addressable unit of a video object stream. A program 102 is a sequence of cells 103 and is usually used to form a chapter of a movie. A program chain 101 is a collection of programs 102. In the example shown in FIG. 1a) the program chain 101 comprises a first program 102 that comprises first to third cells 103a, 103b, 103c. Within a program chain 101, a sequence of navigation commands 104 can be added to begin and end of a program 102 and within a program 102. These navigation commands 104 are called Pre-Commands 104a, Post-Commands 104b and Cell-Commands 104c.

To create regions in a program chain 101 or program 102 that are left-out during playback of type a), i. e. bypassed regions, a first additional cell 105a might be inserted before the first cell 103a and a second additional cell 105b might be inserted before the second cell 103b, and a first branch command might be set into the pre-command 104a and a second branch command might be set into the cell-command 104c, as shown in FIG. 1b). The target address of the first branch commands is set to the first cell 103a of the original program 102 and the target address of the second branch commands is set to the second cell 103b of the original program 102. The pre-command 104a causes the player to start the playback of the program 102 at the first cell 103a and to not access the additional cell 105a. The cell-command 104c causes the player to continue the playback after the first cell 103a of the program 102 at the second cell 103b and to not access the additional cell 105b.

On the other hand, the additional (reproduction obstruction) cells 105a, 105b are physically inserted before the first cell 103a and the second cell 103b, respectively. Therefore, it can be used to make rip/copy difficult or impossible or it can be used to reduce the entertainment value of the content, since copy/rip software generally does not use the navigation data and performs a linear access of the cells of the program 102, i. e. in the shown example of the first additional cell 105a, the first cell 103a, the second additional cell 105b, the second cell 103b, and the third cell 103c, in this order. Such a linear access leads to a corresponding copy and reproduction thereof.

Also the program chains 101 are accessed in a linear manner by copy/rip software. Therefore, it is also possible to reduce the entertainment value of a copy by physically arranging the program chains 101 of an original in an order not in conformity with the intended playback order and using post-commands 104b in a way that the intended playback order is secured. The program chains 101 are then copied and also reproduced from the copy in the order as physically stored on the original.

Such a non-linear storage with the same effect is also possible for programs 102 and/or cells 103. In this case just other relative addressing mechanisms than the pre-commands or post-commands or cell-commands are used.

The use of navigation commands is only one option to create a bypassed region. A second option is the use of interleaved structures as defined in the DVD Video Specification. The target of these interleaved structures is to enable parallel playback paths and the possibility to change seamlessly between the playback paths. Interleaved structures are e. g. used for
- language credits,
- parental levels, and
- multi-angles.

FIG. 4 depicts interleaved presentation data. An interleaved block 106 is a region in the presentation data with parallel playback paths 107, 108. An interleaved block consists of a sequence of interleaved units (ILVU), here respectively of first to third ILVUs 107a, 107b, 107c, of the first playback path 107 and first to third ILVUs 108a, 108b, 108c of the second playback path 108. Every ILVU 107a, 107b, 107c, 108a, 108b, 108c is part of a playback path 107, 108. The ILVUs 107a, 107b, 107c, 108a, 108b, 108c of the playback paths 107, 108 are mixed together in alternating sequence, i. e. in an order first ILVU 108a of second playback path, first ILVU 710a of first playback path, second ILVU 108b of second playback path, second ILVU 107b of first playback path and third ILVU 108c of second playback path, third ILVU 107c of first playback path. Interleaved blocks 106 can be used in a way that they are not visible to the user. Hence an additional playback path can be used as bypassed region, i. e. not selectable by the user during dedicated access, but viewable and not distinguishable for copy/rip software or hardware.

A third example to create a bypassed region is to exploit the fact that DVD video navigation data references data by relative sector addresses. A playback device of type a) has to read the root navigation data file. The remaining presentation and navigation data can be read by directly reading the referenced sectors.

During Playback of type b) in many cases more sectors are read and/or the file system data can be modified in a way that additional sectors are read.

FIG. 5 depicts a possible application of this concept. During access of a playback device of type a) sectors are read in a specific sequence. In particular, after a record carrier gets inserted into a drive for accessing the record carrier, initially the lead-in area 109 gets accessed, before in a first step S1 a jump to the volume description 1010 is performed to read the volume description 1010. Then, in a following second step S2 a jump to the partition description 11 is performed to read the partition description 1011. Thereafter, in a following third step S3 a jump to the root directory 1012 is performed to access the root directory 1012. Following the access of the root directory 1012, in a fourth step S4 a jump to the directory 1013 is performed to access the directory 1013. The access of the directory 1013 then enables a relative jump to a file 1014 in a fifth step S5 and then the access thereof. All following file accesses are also performed in a relative manner dependent on information already available, i. e. available from the current or earlier file or directory accesses.

Data access of type b) in some cases reads additional sectors and/or can be forced to read additional sectors. These additional sectors constitute a bypassed region for the normal type a) access. In the shown example, the first to fifth jumps S1 to S5 with the respective following accesses are also performed during the type b) access. However, the access of the directory 1013 indicates to the copy mechanism to additionally access a further file 1015, since the copy mechanism would otherwise produce an incomplete copy.

Therefore, the copy mechanism performs a sixth jump S6 after the fifth jump S5 to the further file 1015 to enable the access thereof.

Data structures that can be used to force the read of additional sectors are and/or provoke cyclic reading:
- ISO 9660 data, Joliet data
- extended UDF data
- UDF volume/partition data (i.e. more than one volume and/or more than one partition)
- virtual address table
- sparing management data
- presentation data used by specific reading devices e. g. Microsoft operating systems
- hidden files
- icon resources in COFF format executable files
- disc logos
- autorun.inf files
- Mac OS
- resource forks A fourth example to create a bypassed region is to exploit the arrangement of the file system data, i. e. use the linking of the file system data. Bypassed regions, which are e. g. arranged between lead-in 9 and volume description 1010, between volume description 1010 and partition description 11, between partition description 1011 and root directory 1012, between root directory 1012 and directory 1013, and/or between directory 1013 and the first file 1014, are preferably regions that comprise one or more sectors that lead to an abortion of the access of the record carrier, when the one or more sectors are accessed. Such a bypassed region prevents the copying of a disc with a copy software and/or hardware that searches the presentation data in a sequential manner from the beginning of the disc, i. e. read all sectors of the disc in a consecutive manner until a particular marker, e. g. for the beginning of a video stream, is found, e. g. to overcome the third example to create a bypassed region that is elucidated above. FIG. 5 shows a bad sector 1016 arranged between volume description 1010 and partition description 1011 as an example for bypassed region of this type.

Reference Symbols
- 1 non copy protected data
- 2 first network location
- 3 first communication network
- 4 second network location
- 5 copy protected data
- 6 second communication network
- 7 non copy protected data
- 8 copy protected data
- 9, 9' data parts
- 101 program chain
- 102 program
- 103 cell
- 104 navigation command
- 105 additional cell
- 106 interleaved block
- 107 interleaved unit
- 108 interleaved unit
- 109 lead in area
- 1010 volume description
- 1011 partition description
- 1012 root directory
- 1013 directory
- 1014 file
- 1015 file
- 1016 bad sector

The invention claimed is:

1. A method for converting non-copy protected data into copy protected data, said method comprising:

extracting, at a first network device using a first processor of the first network device, data parts of said non-copy protected data from an electronic memory of said first network device on which said non-copy protected data is stored, wherein:

said non-copy protected data includes data structure data, controlling data and a content data, said data parts include said data structure data or said controlling data, or both said data structure data and said controlling data, said content data and said controlling data are embedded into data structures defined by said data structure data, said content data is accessible or processable using a processor and said controlling data, said data structure data defines a layout of information areas, and said controlling data includes navigation data to selectively access or process specific parts of said content data;

transferring said data parts via a first communication network from said first network device to a second network device and storing said data parts onto an electronic memory of said second network device using a processor of said second network device;

generating modified data parts at said second network device with said processor of said second network device in dependence on said data parts supplied to said second network device, said modified data parts including modified data structure data and modified controlling data;

transferring said modified data parts via a second communication network from said second network device to a third network device;

transferring said content data of said non-copy protected data from said first network device to said third network device; and generating, at said third network device using a processor of said third network device, said copy protected data by embedding said content data of said non-copy protected data transferred from said first network device and said modified controlling data transferred from said second network device into modified data structures being defined by said modified data structure data transferred from said second network device and recording said copy protected data onto an electronic memory of said third network device, wherein said generating said copy protected data is performed by said processor of said third network device using assembling software that is prepared by said second network device and that is transferred from said second network device to said third network device.

2. The method according to claim 1, wherein said data structure data, said controlling data and said content data relate to digital audio or video content stored on a data carrier.

3. The method according to claim 1, wherein said data structure data, said controlling data and content data relate to DVD data, respectively.

4. The method according to claim 3, wherein said data structure data comprises DVD file system data.

5. The method according to claim 3 or 4, wherein said controlling data comprises DVD navigation data.

6. The method according to claim 1, wherein said assembling software includes a java applet.

7. The method according to claim 1, wherein all data being exchanged or transferred between said network devices is encrypted before being exchanged.

8. The method according to claim 1, wherein said first network device is identical to or in the same physical location as said third network device.

9. The method according to claim 1, wherein:
said content data forms a content data stream, and
said controlling data is to selectively access or process specific parts of said content data stream.

10. The method according to claim 9, wherein said content data stream is divided into several parallel content data substreams, and said controlling data is to selectively access or process specific parts of each content data substream.

11. The method according to claim 10, wherein
said content data forms a first stream of content cells, at least some of which are linked with each other by said controlling data, and
said copy protected data comprises a second stream of content cells, at least some of which are linked with each other by said modified controlling data.

12. The method according to claim 11, wherein said second stream of content cells is obtained by inserting reproduction obstructing cells into said first stream of content cells during said generating said copy protected data.

13. The method according to claim 12, wherein said generating modified data parts includes determining at which stream positions said reproduction obstructing cells will be inserted into said first stream of content cells during said generating copy protected data.

14. The method according to claim 13, wherein said generating modified data parts includes determining how said reproduction obstructing cells will be linked to said content cells of said second data stream during said generating said copy protected data.

15. A method of generating a master disc for storing a copy protected master image, the method comprising:
extracting, at a first network device using a first processor of the first network device, data parts of a non-copy protected data from an electronic memory of said first network device on which said non-copy protected data is stored, wherein:
said non-copy protected data includes data structure data, controlling data and a content data,
said data parts include said data structure data or said controlling data, or both said data structure data and said controlling data,
said content data and said controlling data are embedded into data structures defined by said data structure data,
said content data is accessible or processable using a processor and said controlling data,
said data structure data defines a layout of information areas, and
said controlling data includes navigation data to selectively access or process specific parts of said content data;
transferring said data parts via a first communication network from said first network device to a second network device and storing said data parts onto an electronic memory of said second network device using a processor of said second network device;
generating modified data parts at said second network device with said processor of said second network device in dependence on said data parts supplied to said second network device, said modified data parts including modified data structure data and modified controlling data;
transferring said modified data parts via a second communication network from said second network device to a third network device;
transferring said content data of said non-copy protected data from said first network device to said third network device;
generating, at said third network device using a processor of said third network device, said copy protected master image by embedding said content data content data of said non-copy protected data transferred from said first network device and said modified controlling data transferred from said second network device into modified data structures being defined by said modified data structure data transferred from said second network device, wherein
said generating said copy protected master image is performed by said processor of said third network device using assembling software that is prepared by said second network device and that is transferred from said second network device to said third network device; and
recording said copy protected master image onto a disc to generate said master disc using a disc recording device, said master disc accessible so as to allow transfer of said copy protected master image onto a plurality of data carriers.

16. A system for converting non-copy protected data into copy protected data, said system comprising:
a mastering device comprising a hardware processor configured to:
extract data parts of said non-copy protected data from an electronic memory of said mastering device on which said non-copy protected data is stored, wherein:
said non-copy protected data includes data structure data, controlling data and a content data,
said data parts include said data structure data or said controlling data, or both said data structure data and said controlling data, said content data and said controlling data are embedded into data structures defined by said data structure data, said content data is accessible or processable using a processor and said controlling data, said data structure data defines a layout of information areas, and said controlling data includes navigation data to selectively access or process specific parts of said content data, transmit said data parts via a network, and transmit said content data via the network;

an encryption device comprising a hardware processor configured to:

receive said data parts from said mastering device via the network, store said data parts onto an electronic memory of said encryption device, generate modified data parts from said data parts received from said mastering device, said modified data parts including modified data structure data and modified controlling data, and transmit said modified data parts via the network; and a replication device comprising a hardware processor configured to:

receive said modified data parts from said encryption device, receive said content data of said non-copy protected data from said mastering device, generate said copy protected data by embedding said content data of said non-copy protected data received from said mastering device and said modified controlling data received from said encryption device into modified data structures being defined by said modified data structure data received from said encryption device, wherein the replication device is configured to generate said copy protected data by a processor of said replication device using assembling software that is prepared by said encryption device and that is transferred from said encryption device to said replication device, and write said copy protected data onto a master disc of said replication device.

17. A computer system including computer executable instructions, wherein the instructions, when executed by a processor, cause the processor to perform a method comprising:

extracting, by a first network device using a first processor of the first network device, data parts a non-copy protected data from an electronic memory of said first network device on which said non-protected data is stored, wherein:

said non-copy protected data includes data structure data, controlling data and a content data, said data parts include said data structure data or said controlling data, or both said data structure data and said controlling data, said content data and said controlling data are embedded into data structures defined by said data structure data, said content data is accessible or processable using a processor and said controlling data, said data structure data defines a layout of information areas, and said controlling data includes navigation data to selectively access or process specific parts of said content data;

transferring said data parts via a first communication network from said first network device to a second network device and storing said data parts onto an electronic memory of said second network device using a processor of said second network device;

generating modified data parts by said second network device with said processor of said second network device in dependence on said data parts supplied to said second network device, said modified data parts including modified data structure data and modified controlling data;

transferring said modified data parts via a second communication network from said second network device to a third network device;

transferring said content data of said non-copy protected data from said first network device to said third network device; and generating, by said third network device using a processor of said third network device, copy protected data by embedding said content data of said non-copy protected data transferred from said first network device and said modified controlling data transferred from said second network device into modified data structures being defined by said modified data structure data transferred from said second network device and recording said copy protected data onto an electronic memory of said third network device, wherein said generating said copy protected data is performed by said processor of said third network device using assembling software that is prepared by said second network device and that is transferred from said second network device to said third network device.

18. A method for converting non-copy protected data into copy protected data, said method comprising:

extracting, at a first network device using a first processor of the first network device, data parts of said non-copy protected data from an electronic memory of said first network device on which said non-copy protected data is stored, wherein:

said non-copy protected data includes controlling data and a content data, said data parts include said controlling data, said content data is accessible or processable by a processor and said controlling data, said controlling data includes navigation data to selectively access or process specific parts of said content data, and said content data forms a first content data stream of content cells, at least some of the content cells being linked with each other by the controlling data;

transferring said data parts via a first communication network from said first network device to a second network device and storing said data parts onto an electronic memory of said second network device using a processor of said second network device;

generating modified data parts at said second network device with said processor of said second network device in dependence on said data parts supplied to said second network device, said modified data parts including modified controlling data;

transferring said modified data parts via a second communication network from said second network device to a third network device;

transferring said content data of said non-copy protected data from said first network device to said third network device; and generating, at said third network device using a processor of said third network device, said copy protected data by forming a stream of content cells, at least some of which are linked with each other by the modified controlling data transferred from said second network device, wherein said generating said copy protected data is performed by said processor of said third network device using assembling software that is prepared by said second network device and that is transferred from said second network device to said third network device.

19. A method for converting non-copy protected data into copy protected data, said method comprising:

extracting, at a first network device using a first processor of the first network device, data parts of said non-copy protected data from an electronic memory of said first network device on which said non-copy protected data is stored, wherein:

said non-copy protected data includes data structure data, controlling data and a content data, said data parts include said data structure data or said controlling data, or both said data structure data and said controlling data, said data structure data defines a layout of information areas, said content data is accessible or processable by a processer and said controlling data, said content data forms a content data stream, and said controlling data includes navigation data to selectively access or process specific parts of said content data stream by said first processor of said first network device based on said controlling data;

transferring said data parts via a first communication network from said first network device to a second network device and storing said data parts onto an electronic memory of said second network device using a processor of said second network device;

generating modified data parts at said second network device with said processor of said second network device in dependence on said data parts supplied to said second network device, said modified data parts including modified data structure data and modified controlling data;

transferring said modified data parts via a second communication network from said second network device to a third network device;

transferring said content data of said non-copy protected data from said first network device to said third network device; and generating, at said third network device using a processor of said third network device, said copy protected data by embedding said content data of said non-copy protected data transferred from said first network device and said modified controlling data transferred from said second network device into modified data structures defined by said modified data structure data transferred from said second network device and recording said copy protected data onto an electronic memory of said third network device, wherein said generating said copy protected data is performed by said processor of said third network device using assembling software that is prepared by said second network device and that is transferred from said second network device to said third network device.

\* \* \* \* \*